(12) United States Patent
Matsubayashi

(10) Patent No.: US 9,488,333 B2
(45) Date of Patent: Nov. 8, 2016

(54) LIGHTING DEVICE

(71) Applicant: PANASONIC CORPORATION, Osaka (JP)

(72) Inventor: Yoko Matsubayashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 194 days.

(21) Appl. No.: 13/905,485

(22) Filed: May 30, 2013

(65) Prior Publication Data

US 2013/0329420 A1    Dec. 12, 2013

(30) Foreign Application Priority Data

Jun. 12, 2012  (JP) ................... 2012-133048

(51) Int. Cl.
*F21V 9/08* (2006.01)
*H05B 33/08* (2006.01)
*H01L 25/075* (2006.01)
*F21Y 101/00* (2016.01)

(52) U.S. Cl.
CPC .............. *F21V 9/08* (2013.01); *H05B 33/0857* (2013.01); *F21Y 2101/00* (2013.01); *F21Y 2113/13* (2016.08); *F21Y 2115/10* (2016.08); *H01L 25/0753* (2013.01); *H01L 2924/0002* (2013.01)

(58) Field of Classification Search
CPC ....... F21S 4/005; F21S 48/115; H01L 33/58; H01L 25/0753; H01L 2924/0002; B60Q 1/1438; B60Q 1/2607; B60Q 1/0041; F21W 2131/406; F21Y 2101/02; F21Y 2101/00; F21Y 2115/10; F21Y 2113/13; F21K 9/00; F21V 9/08; H05B 33/0857

USPC .......... 362/231, 249.02, 555, 227, 230, 543, 362/544, 545
See application file for complete search history.

(56) References Cited

U.S. PATENT DOCUMENTS

2007/0291467 A1    12/2007 Nagai et al.
2008/0220260 A1*    9/2008 Schmidt et al. ............... 428/426
2010/0188022 A1*    7/2010 Gerlach et al. ............... 315/312

(Continued)

FOREIGN PATENT DOCUMENTS

CN    201748320    2/2011
CN    102128432    7/2011
CN    102244185    11/2011

(Continued)

OTHER PUBLICATIONS

White Light Emitting Diode Lamps for Lighting Applications by Hirosaki et al., Fujikura Technical Review, 2006, pp. 1-4.*

(Continued)

*Primary Examiner* — Stephen F Husar
*Assistant Examiner* — Danielle Allen
(74) *Attorney, Agent, or Firm* — Greenblum & Bernstein, P.L.C.

(57) ABSTRACT

A lighting device is provided with an LED light source including a light bulb color LED, a blue LED, and a green LED. The light bulb color LED has a peak wavelength in the range from 580 to 630 nm and a half width at the peak wavelength in the range from 120 nm to 175 nm. The light bulb color LED is specified by Japanese Industrial Standard (JIS) Z9112. The blue LED has a peak wavelength in the range from 450 nm to 480 nm. The green LED has a peak wavelength in the range from 500 nm to 530 nm.

5 Claims, 7 Drawing Sheets

(56) References Cited

U.S. PATENT DOCUMENTS

2012/0008318 A1 1/2012 Ishiwata et al.
2012/0300432 A1 11/2012 Matsubayashi et al.

FOREIGN PATENT DOCUMENTS

| CN | 202127017 | 1/2012 |
|---|---|---|
| CN | 102341925 | 2/2012 |
| CN | 102454945 | 5/2012 |
| CN | 102478179 | 5/2012 |
| CN | 202259297 | 5/2015 |
| JP | 2002-013982 | 1/2002 |
| JP | 2003-298113 | 10/2003 |
| JP | 2006-260831 | 9/2006 |
| JP | 2007-299590 | 11/2007 |
| JP | 2008-505433 | 2/2008 |
| JP | 2009-117080 | 5/2009 |
| JP | 2011-108597 | 6/2011 |
| JP | 2011-175793 | 9/2011 |
| JP | 2012-064888 | 3/2012 |
| WO | 2012/000386 | 1/2012 |

OTHER PUBLICATIONS

"Technical Application Guide for Philips LED Lamps 12V Philips EnduraLED 10W MR16 Dimmable", Philips Technical Application Guides, XP055088396, Aug. 1, 2010, pp. 3.
"Toshiba LED Application Notes, Photometry Terms and Units", Toshiba, XP002716379, URL:http://www.semicon.toshiba.co.jp/info/docget.jsp?type=AplNote6&lang=en&pid=TL2FK-LLI,L, Oct. 1, 2013, pp. 4.
Search report from E.P.O., mail date is Nov. 28, 2013.
China Office action, mail date is Nov. 27, 2014.
China Office action, dated Jun. 8, 2015 along with an English translation thereof.
Office Action issued in Japan Counterpart Patent Appl. No. 2012-133048, dated on Mar. 8, 2016.

\* cited by examiner

Color Temperature 4200K

Color Temperature 5200K

Color Temperature 7200K

Fig.10A

Color Temperature 4400K

| | | G Wavelength (nm) | | | | | | |
|---|---|---|---|---|---|---|---|---|
| | | 500 | 505 | 510 | 515 | 520 | 525 | 530 |
| B Wavelength (nm) | 450 | ○ ○ | ○ ○ | ○ ○ | ○ ○ | ○ ○ | ○ ○ | ○ ○ |
| | 460 | ○ ○ | ○ ○ | ○ ○ | ○ ○ | ○ ○ | ○ ○ | ○ ○ |
| | 470 | ○ ○ | ○ ○ | ○ ○ | ○ ○ | ○ ○ | ○ ○ | ○ ○ |
| | 480 | × ○ | ○ ○ | ○ ○ | ○ ○ | ○ ○ | ○ ○ | ○ ○ |

Fig.10B

Color Temperature 5300K

| | | G Wavelength (nm) | | | | | | |
|---|---|---|---|---|---|---|---|---|
| | | 500 | 505 | 510 | 515 | 520 | 525 | 530 |
| B Wavelength (nm) | 450 | ○ ○ | ○ ○ | ○ ○ | ○ ○ | ○ ○ | ○ ○ | ○ ○ |
| | 460 | ○ ○ | ○ ○ | ○ ○ | ○ ○ | ○ ○ | ○ ○ | ○ ○ |
| | 470 | × ○ | × ○ | ○ ○ | ○ ○ | ○ ○ | ○ ○ | ○ ○ |
| | 480 | × ○ | × ○ | ○ ○ | ○ ○ | ○ ○ | × ○ | × ○ |

Fig.10C

Color Temperature 7100K

| | | G Wavelength (nm) | | | | | | |
|---|---|---|---|---|---|---|---|---|
| | | 500 | 505 | 510 | 515 | 520 | 525 | 530 |
| B Wavelength (nm) | 450 | × ○ | × ○ | ○ × | ○ × | ○ × | ○ × | ○ × |
| | 460 | × ○ | × ○ | ○ ○ | ○ ○ | ○ ○ | ○ ○ | ○ ○ |
| | 470 | × ○ | × ○ | × ○ | × ○ | × ○ | × ○ | × ○ |
| | 480 | × ○ | × ○ | × ○ | × ○ | × ○ | × ○ | × ○ |

LIGHTING DEVICE

CROSS-REFERENCE TO RELATED APPLICATIONS

This application is based upon and claims the benefit of priority from prior Japanese Patent Application No. 2012-133048, filed on Jun. 12, 2012, the entire contents of which are incorporated herein by reference.

BACKGROUND ART

The present invention relates to a lighting device including an LED.

Light-emitting diodes (LEDs) are increasingly used as light sources that can replace incandescent light bulbs and fluorescent lamps. Since LED elements are small, various types of LED elements may be combined to form a variable color unit.

A lighting device including an LED is often designed to have a general color rendering index of 80 or greater to satisfy the indoor lighting conditions specified by Japanese Industrial Standard (JIS) Z9110:2004. The general color rendering index Ra is used to quantitatively evaluate the level a color can be truly reproduced under a subject light source in comparison with a reference light. Thus, when a light source has a high general color rendering index Ra, the light source ensures reproduction of a color appearance under the reference light. However, when the plane of a paper appears to be colored by light of various colors, the general color rendering index Ra cannot be used to evaluate the light source. Thus, even when the general color rendering index Ra is high, the plane of a paper may appear to be colored. This may decrease the contrast between characters and the background and make it difficult to read characters.

Accordingly, it is desirable that the whiteness of a paper plane be quantitatively evaluated to provide light that is suitable for reading. Japanese Laid-Open Patent Publication No. 2002-13982 describes a method for calculating the whiteness level from the spectrum of a fluorescent lamp. The whiteness level is used as an index quantitatively indicating the whiteness of a paper plane under lighting. In Japanese Laid-Open Patent Publication No. 2002-13982, a lighting device uses a fluorescent lamp as a light source, and the chromaticity range is limited to the proximity of 5000 K and the proximity of 8000 K in correlated color temperature.

However, the lighting device of the publication uses the fluorescent lamp as the light source and has a spectrum that differs greatly from a lighting device that uses an LED as a light source. Thus, it is difficult to directly apply an LED element to the above light device. Further, as described above, when a colored light is evaluated with only the general color rendering index Ra, the paper plane may appear to be colored making it difficult to read characters. When increasing only the whiteness of a paper plane under lighting, a low general color rendering index Ra may lower the reproductivity of chromatic colors and result in colors appearing strange to a user.

SUMMARY OF THE INVENTION

One aspect of the present invention is a lighting device provided with an LED light source including a light bulb color LED, a blue LED, and a green LED. The light bulb color LED has a peak wavelength in the range from 580 nm to 630 nm and a half width at the peak wavelength in the range from 120 nm to 175 nm. The light bulb color LED is specified by Japanese Industrial Standard (JIS) Z9112. The blue LED has a peak wavelength in the range from 450 nm to 480 nm. The green LED has a peak wavelength in the range from 500 nm to 530 nm.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 10A to 10C are charts showing the chroma value and the general color rendering index Ra for each color temperature in a combination of the wavelengths of a blue LED and a green LED.

DETAILED DESCRIPTION OF THE INVENTION

A lighting device according to one embodiment of the present invention will now be described with reference to the drawings.

Figure 1:
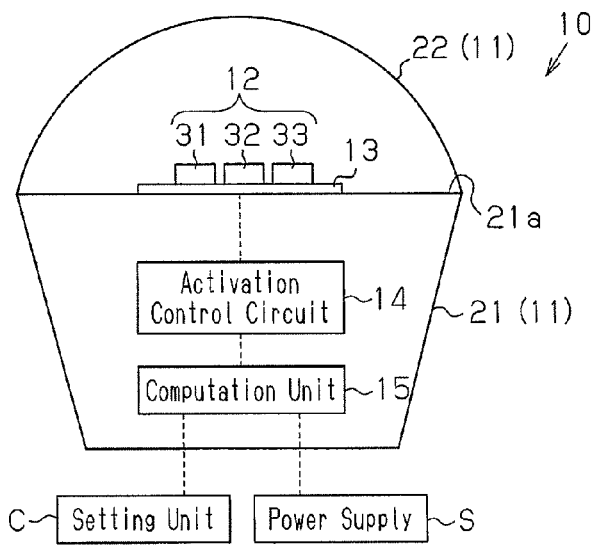
FIG. 1 is a schematic diagram of a lighting device according to one embodiment of the present invention.

Referring to FIG. 1, a lighting device 10 of the present embodiment includes a casing 11. The casing 11 accommodates an LED module 12, a circuit board 13, an activation control circuit 14, and a computation unit 15.

As shown in FIG. 1, the casing 11 includes a housing 21 and a semispherical globe 22. The housing 21 is hollow and has the shape of a truncated cone. The circuit board 13 is attached to an upper surface 21a of the housing 21, and the LED module 12 is coupled to the circuit board 13. The housing 21 accommodates the activation control circuit 14, which is electrically connected to a circuit pattern (not shown) of the circuit board 13, and the computation unit 15, which controls the activation control circuit 14. The computation unit 15 is connectable to a power supply S. When supplied with power from the power supply S, the computation unit 15 provides the activation control circuit 14 with a control signal that sets the color and amount of the light generated by the LED module 12 within the specification range based on an operation signal provided from a setting unit C (operation unit), which may be operated by a user.

The LED module 12 includes a white LED 31, a blue LED 32, and a green LED 33.

The white LED 31 includes a gallium nitride blue LED element, which has a light emission intensity that becomes highest at a peak wavelength in the range from 450 nm to 480 nm, and a light transmissive member, which encloses the blue LED element. The light transmissive member includes a green-yellow fluorescent body and a red fluorescent body. The green-yellow fluorescent body may be $(Y, Gd)_3Al_5O_{12}:Ce^{3+}$, $Y_3Al_5O_{12}:Ce^{3+}$, $Pr^{3+}$, $(Tb, Gd)_3Al_5O_{12}:Ce^{3+}$, $(Sr, Ba)_2SiO_4:Eu^{2+}$, $(Sr, Ca)_2SiO_4:Eu^{2+}$, $CaSi_2O_2N_2:Eu^{2+}$, $Ca-\alpha-SiAlON:Eu^{2+}$, $Y_2Si_4N_6C:Ce^{3+}$, or $CaGa_2S_4:Eu^{2+}$. The red fluorescent body may be $Ca-\alpha-SiAlON:Eu^{2+}$, $CaAlSiN_3:Eu^{2+}$, $(Sr, Ca)AlSiN_3:Eu^{2+}$, $Sr_2Si_5N_8:Eu^{2+}$, $Sr_2(Si, Al)_5(N, O)_8:Eu^{2+}$, $CaS:Eu^{2+}$, or $La_2O_2S:Eu^{2+}$.

Figure 3:
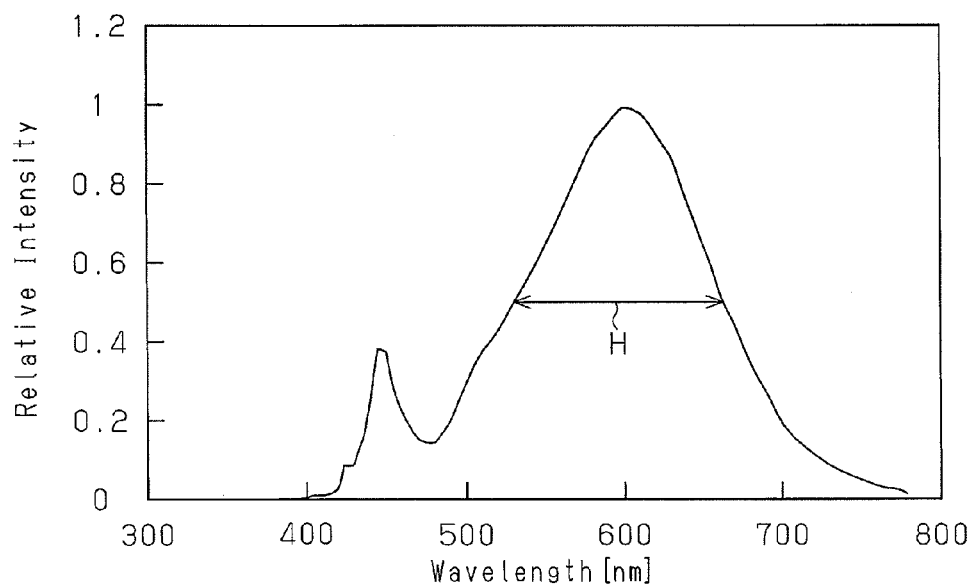
FIG. 3 is a chart showing the spectral distribution for a white LED of the lighting device.
Figure 7:
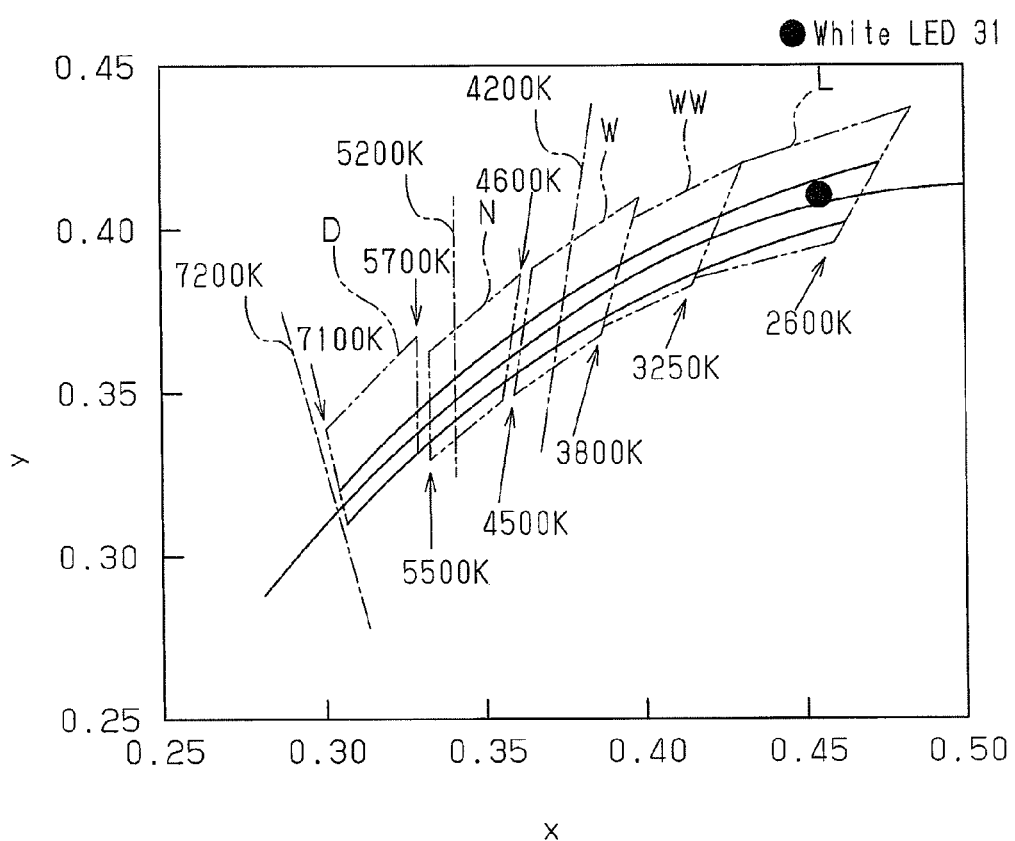
FIG. 7 is a chart illustrating the white LED under a light color classification in accordance with JIS Z9112:2004.

Further, the white LED 31 has the spectral distribution shown in FIG. 3. More specifically, referring to FIG. 3, the white LED 31 has a peak wavelength in the range from 580 nm to 630 nm, and the half width H at the peak wavelength is in the range from 120 nm to 175 nm. Further, the white LED 31 is configured to emit light of a light bulb color (correlated color temperature of approximately 2800 K) having the lowest color temperature among the colors of a while light source. The light bulb color classification is specified by JIS Z9112:2004 "Classification of Light Source Color and Color Rendering for Fluorescent Lamp." In the xy chromaticity chart of FIG. 7, the light of the light bulb color classification has chromaticity in the range indicated by "L.". More specifically, the light of the light bulb color classification has a correlated color temperature in the range from 2600 K to 3250 K, and chromaticity in a tetragonal range formed by connecting the points at the chromaticity coordinates of (0.4834, 0.4382), (0.4594, 0.3971), (0.4305, 0.4218), and (0.4153, 0.3862). In FIG. 7, in the same manner as JIS 29112, the remaining light color classifications of the five light color classifications are indicated by "D" for a daylight color, "N" for a natural color, "W" for a white color, and "WW" for a warm white color.

The blue LED 32 in the LED module 12 is configured to have a light emission intensity that becomes highest at a peak wavelength of approximately 470 nm in the range from 450 nm to 480 nm.

The green LED 33 in the LED module 12 is configured to have a light emission intensity that becomes highest at a peak wavelength of approximately 530 nm in the range from 510 nm to 530 nm.

Figure 4:
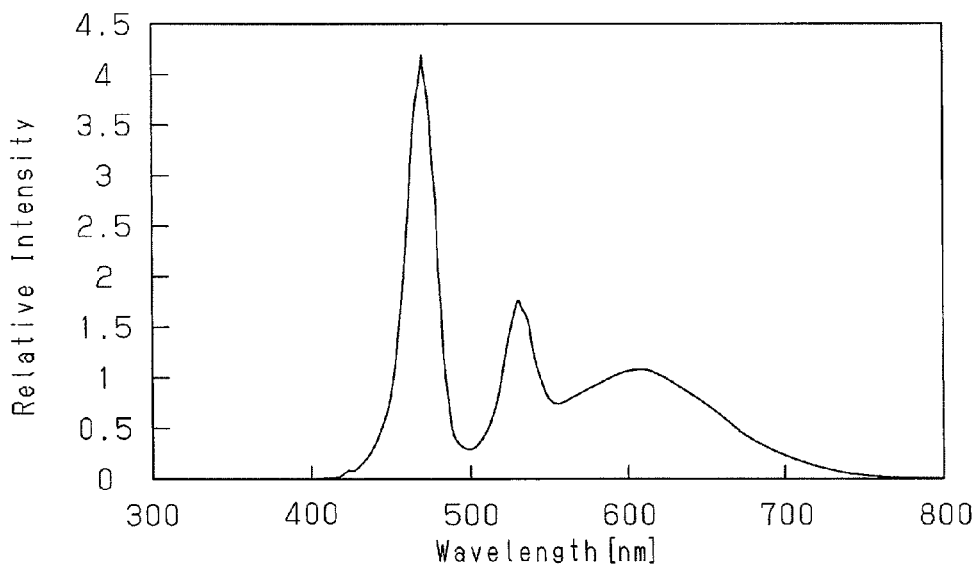
FIG. 4 is a chart showing one example of the spectral distribution for an LED module of the lighting device.
Figure 5:
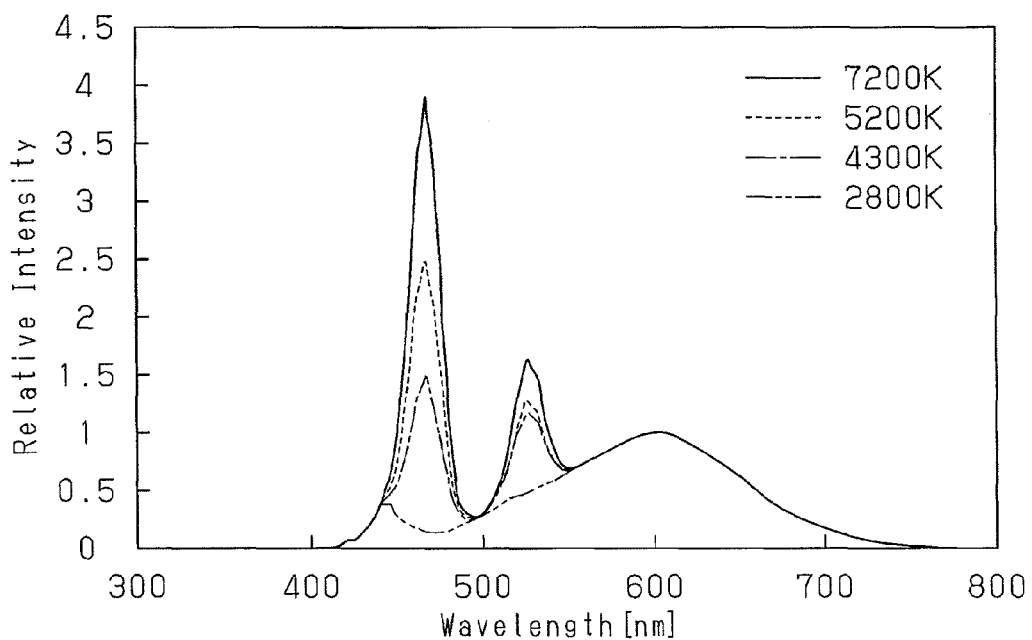
FIG. 5 is a chart showing the spectral distributions for the LED module and the white LED of the lighting device.

Activation of the LED module 12 allows for emission of light having the spectral distribution shown in FIG. 4, for example. The LED module 12 of the present embodiment changes the emission intensities of the blue LED 32 and the green LED 33 relative to the white LED 31 to vary the spectral distribution of light in the range from daylight color to warm white color as shown by the dotted line (5200 K) and the single-dashed line (4300 K) shown in FIG. 5. Here, as shown in FIG. 5, the blue LED 32 and the green LED 33 has a light emission intensity of one or greater when the light emission intensity at the main peak wavelength of the white LED 31 is one.

For the lighting device 10, the inventor of the present invention has focused on the chroma value to improve legibility.

Figure 2:
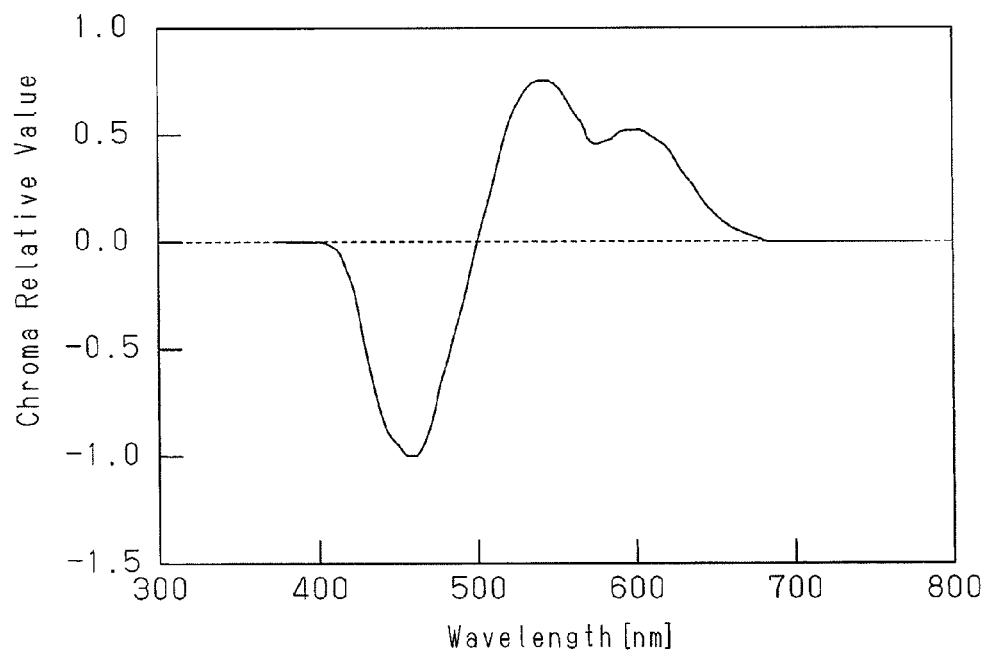
FIG. 2 is a chart illustrating the relationship of an added wavelength, when adding wavelength energy of a 5 nm width for every 5 nm based on equi-energy white light, and a chroma calculated value of a newspaper, obtained from the CIE 1998 Interim Color Appearance Model (Simple Version)

First, the inventor studied (calculated) the chroma value according to the CIE 1997 Interim Color Appearance Model (Simple Version), or CIECAM97s, for a newspaper when adding energy for every 5 nm based on an equi-energy white light (light having equal emission energy throughout the entire wavelength band of visible light). The calculation results are shown in FIG. 2. The horizontal axis in FIG. 2 represents the wavelength of the added energy. The vertical axis represents the difference (chroma difference) of a chroma calculated value of the newspaper when using a light source having a spectrum obtained by adding to the equi-energy white light the energy of the wavelength, and a chroma calculated value of the newspaper when using a light source of equi-energy white light. The chroma calculated value is obtained by performing a calculation specified by CIECAM97s, and the chroma value indicates the colorfulness intensity. A color having a lower chroma value has low colorfulness and is perceived as having a high whiteness.

As apparent from FIG. 2, a wavelength range effective for a chroma decrease is from approximately 415 nm to approximately 495 nm, preferably, from 455 nm to 475 nm, and more preferably, from 460 nm to 470 nm.

The inventor of the present invention conducted a subjective evaluation test to check the easiness for reading characters on a viewed subject (e.g., paper plane) based on whiteness under a lighting, that is, to check improvements in legibility. The test was conducted on five persons, or test subjects. A liquid crystal filter was added to a xenon lamp and a testing device realizing a certain spectral distribution was used to reproduce reference light with a conventional white LED having a color temperature of 5000 K. The testing device was used to reproduce three types of light having the color temperatures of 3000 K, 5000 K, and 6700 K as test light having a spectrum realized by adding a blue LED having a peak wavelength at 470 nm and a green LED having a peak wavelength at 530 nm to a white LED having a color temperature of 2800 K. The reference light and the test light were set to an illuminance of 300 lx. The viewed subject of the test was a newspaper, and the distance between the test subject and the newspaper (viewing distance) was set to 50 cm. Each test subject was given five minutes to adapt to the surrounding environment and then fifty seconds to adapt to the reference light. Then, the test subject was given ten seconds to read the same section of the newspaper. Here, a magnitude estimation method was used to evaluate the legibility of the newspaper in which the color appearance under the reference light was expressed by 100. The test subject gave a number higher than 100 when the newspaper was easier to read than under the reference light and a number lower than 100 when the newspaper was harder to read than under the reference light. At the same time as when the evaluation test was conducted, the test subject gave a five-grade evaluation on the legibility in which the test subject evaluated the easiness to read was graded as "extremely easy to read," "rather easy to read," "can be read normally," "rather difficult to read," and "extremely difficult to read."

Figure 6:
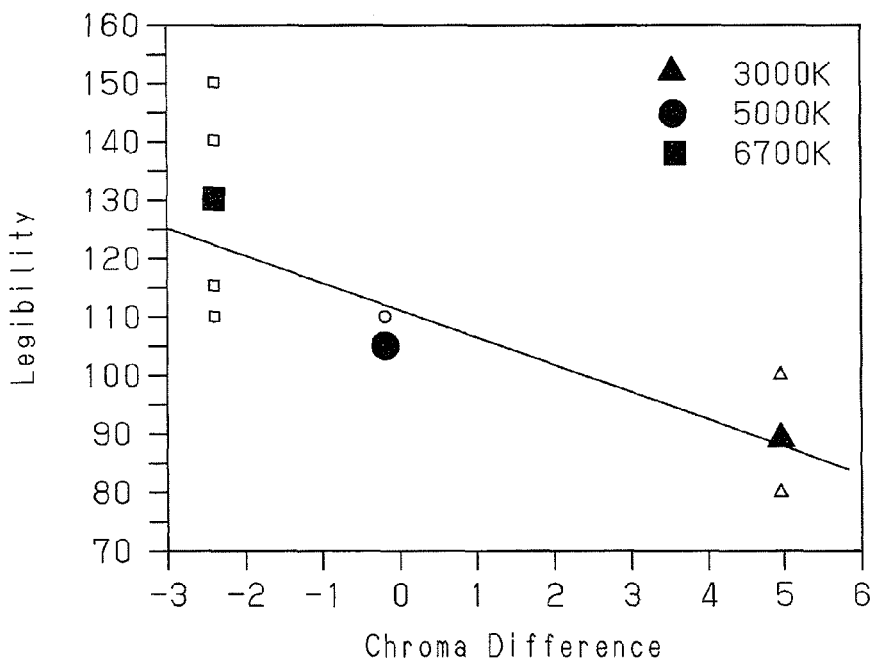
FIG. 6 is a chart showing the results of a subjective evaluation test for chroma difference and legibility.

FIG. 6 shows the results of the subjective evaluation test conducted in accordance with the magnitude estimation method. The horizontal axis in FIG. 6 represents the chroma difference of the newspaper, and the vertical axis represents the evaluation value of the legibility. An assessment of the significance difference (P<0.05) indicated a significant difference in legibility between 3000 K, 5000 K, and 6700 K. Further, the simultaneously conducted five-grade evaluation indicated that the correlation with the magnitude evaluation value was high. Due to the correlation, the magnitude evaluation value of approximately "100" corresponded to "can be read normally" in the five-grade evaluation and the magnitude evaluation value of approximately "110" corresponded to "rather easy to read" in the five-grade evaluation. More specifically, between 5000 K and 6700 K, 80% of the test subjects changed their five-grade evaluation from "can be read normally" to "rather easy to read" or higher. In this case, the chroma difference was approximately 2.4.

Consequently, it may be understood that the whiteness of a viewed subject under lighting increases when the chroma value decreases, thereby improving the easiness to read characters on the viewed subject (legibility). It may also be understood that the test subjects perceived a difference in legibility between light colors.

Figure 8A:
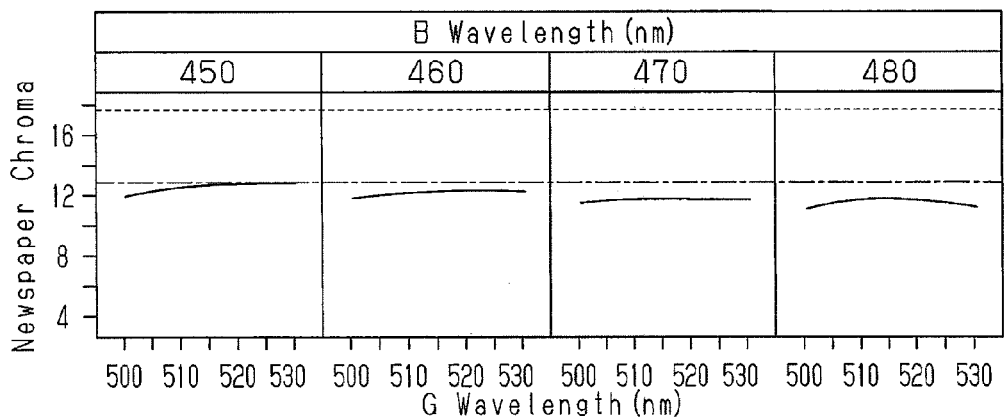
FIGS. 8A to 8C are charts showing the chroma value for each color temperature of a newspaper obtained from the CIE 1997 Interim Color Appearance Model (Simple Version) in the LED module.
Figure 8B:
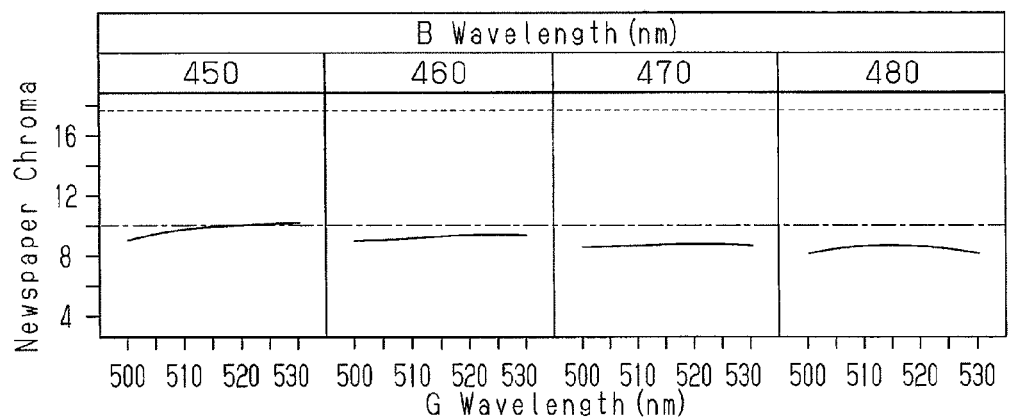
Figure 8C:
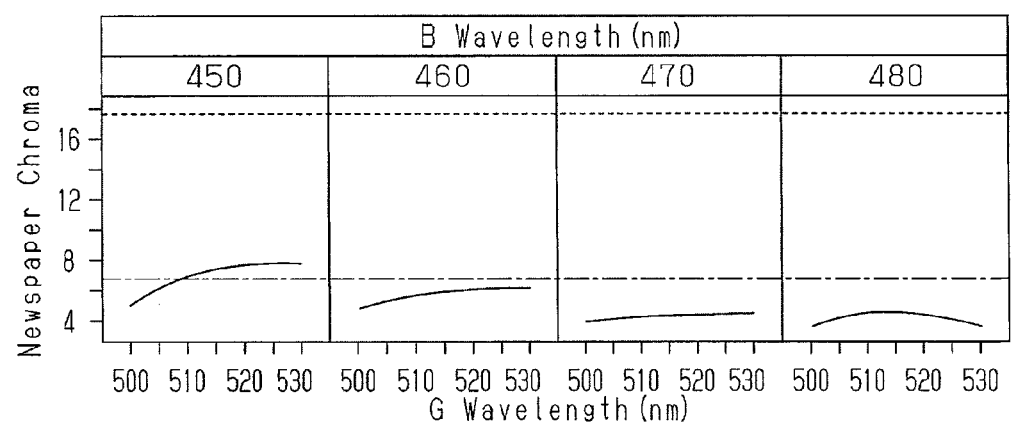

FIG. 8 shows a chart, for each correlated color temperature, of the chroma calculation result in accordance with CIECAM97s under the lighting of the LED module 12 obtained by adding a combination of a B wavelength (blue LED 32) and a G wavelength (green LED 33) to the white LED 31 having the color temperature of 2800 K. In FIG. 8, the solid lines show the chroma value of the LED module 12, the dotted lines show the chroma value of the light bulb color white LED 31, and the single-dashed lines show the chroma value of a typical white LED formed by combining a YAG fluorescent body with a blue LED having a color temperature of 4200 K, 5200 K, and 7200 K.

As shown in FIG. 8, the chroma value is approximately 17 for the light bulb color white LED 31 having a color temperature of approximately 2800 K. In the range in which the color temperature is 4200 K or greater, the chroma value of the LED module 12 is approximately 12 or less, and the chroma value is decreased by about 5. Thus, an improvement in the legibility can be recognized. When the correlated color temperature is the same, light having a Duv, which represents a color shift (shift from Planckian locus), in the range from approximately ±3 is generally recognized as having a similar light color.

Further, it can be understood from FIG. 8 that the spectral distribution of the LED module 12 obtained by adding the blue LED 32 and the green LED 33 to the white LED 31 having a color temperature of 2800 K has a lower chroma value than a typical, commercially available white LED (combination of blue LED and YAG fluorescent body). When the chroma value of the LED module 12 is low, the whiteness of a viewed subject is higher under the lighting of the LED module 12. This improves the legibility of characters on the viewed subject.

Figure 9A:
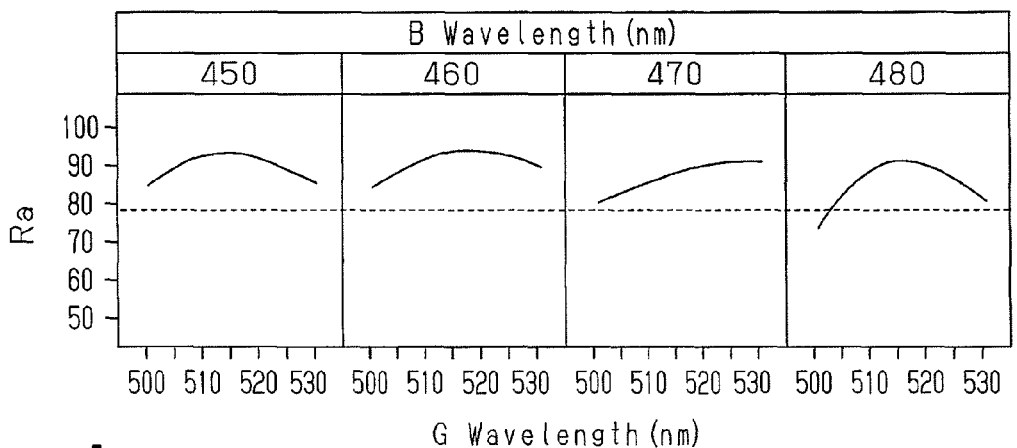
FIGS. 9A to 9C are charts showing the general color rendering index Ra for each color temperature in the LED module.
Figure 9B:
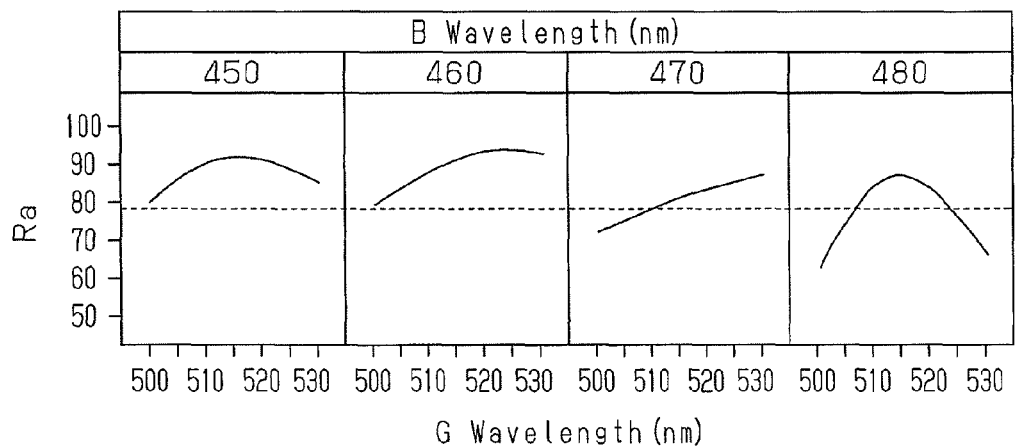
Figure 9C:
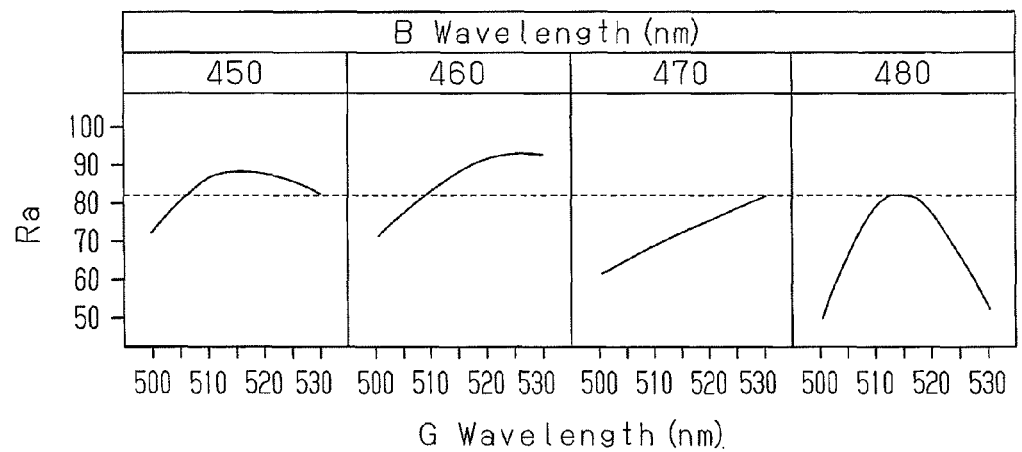

FIG. 9 shows the calculation result of the general color rendering index Ra of the LED module 12 obtained by adding the combination of the B wavelength (blue LED 32) and the G wavelength (green LED 33) to the white LED 31 having the color temperature of 2800 K. In FIG. 9, the solid lines show the general color rendering index Ra of the LED module 12, and the dotted lines show the general color rendering index Ra of 80. As apparent from FIG. 9, in accordance with the correlated color temperature, the combination of the B wavelength (blue LED 32) and the G wavelength (green LED 33) is restricted when satisfying the condition of a general color rendering index Ra that is greater than or equal to 80.

Based on the results shown in FIGS. 8 and 9, with regard to the wavelength combination of the blue LED 32 and the green LED 33 added to the white LED 31, the inventor of the present invention has studied the chroma value and color rendering for other color temperatures (4400 K, 5300 K, and 7100 K). The results are shown in FIG. 10. In each box of FIG. 10, a circle at the left side indicates that the general color rendering index Ra was 80 or greater, and a cross at the left side indicates that the general color rendering index Ra was less than 80. Further, in each box of FIG. 10, a circle at the right side indicates that the chroma value for the combination of a light bulb color white LED, a blue LED, and a green LED is lower than the chroma value for a typical white LED. A cross at the right side indicates that the chroma value for the combination of the light bulb color white LED, the blue LED, and the green LED is greater than or equal to the chroma value for the typical white LED. Thus, a box containing two circles indicates a range in which the reading easiness (legibility) and the color appearance have both been improved.

The results show that when the correlated color temperature is in the range from 3250 K to 4400 K and the color shift Duv is in the range from 3 to −3, the reading easiness and the color appearance may both be improved by adding, to the light bulb color white LED 31, the combination of the blue LED 32 having a peak wavelength in the range from 450 nm to 480 nm and the green LED 33 having a peak wavelength in the range from 505 nm to 530 nm. When further decreasing the chroma (increase whiteness), it is preferable that the blue LED 32 have a peak wavelength in the range from 455 nm to 480 nm.

When the correlated color temperature is in the range from 3250 K to 5300 K and the color shift Duv is in the range from 3 to −3, the reading easiness and the color appearance may both be improved by adding, to the light bulb color white LED 31, the combination of the blue LED 32 having a peak wavelength in the range from 450 nm to 475 nm and the green LED 33 having a peak wavelength in the range from 510 nm to 530 nm. When further decreasing the chroma (increase whiteness), it is preferable that the blue LED 32 have a peak wavelength in the range from 455 nm to 475 nm.

When the correlated color temperature is in the range from 3250 K to 7100 K and the color shift Duv is in the range from 3 to −3, the reading easiness and the color appearance may both be improved by adding, to the light bulb color white LED 31, the combination of the blue LED 32 having a peak wavelength in the range from 450 nm to 465 nm and the green LED 33 having a peak wavelength in the range from 510 nm to 530 nm. Here, JIS Z9112:2004 specifies the upper limit (7100 K) of the color temperature of daylight color, which is a light color classification of a relatively high color temperature, as the light color for white light. In the present embodiment, this upper limit is specified as the upper limit for the color temperature of the LED module 12. When further decreasing the chroma (increase whiteness), it is preferable that the blue LED 32 have a peak wavelength in the range from 455 nm to 465 nm.

Since the blue LED 32 and the green LED 33 are added to the light bulb color white LED, the luminous flux may be set to be low at a low color temperature and set to be high at a high color temperature. Generally, a light color having a low color temperature is used for a relaxing situation, and a light color having a high color temperature is used for a reading situation. These situations have different desirable illuminance levels. Low illuminance is desirable for a relaxing situation, and high illuminance is desirable for a reading situation. Thus, when adding the blue LED 32 and the green LED 33 to the light bulb color white LED 31, at a high color temperature, the legibility of characters resulting from the whiteness of a paper plane and the illuminance may be drastically improved.

The lighting device of the present embodiment has the advantages described below.

(1) The LED module 12 includes the white LED 31 having the light bulb color specified by JIS Z9112:2004. The light bulb color white LED 31 has a peak wavelength in the range from 580 nm to 630 nm, and a half width at the peak wavelength in the range from 120 nm to 175 nm. The LED module 12 includes a blue LED 32, and the blue LED 32 is configured to have a peak wavelength in the range from 450 nm to 480 nm. The LED module 12 includes the green LED 33, and the green LED 33 is configured to have a peak wavelength in the range from 500 nm to 530 nm. This structure increases the whiteness of a viewed subject under the lighting of the LED module 12 and improves the visibility of characters on a viewed subject, while maintaining high color rendering.

(2) When the white LED 31 has a light emission intensity expressed by 1 at the peak wavelength, each of the blue LED 32 and the green LED 33 is configured to have a light emission intensity of 1 or greater. This structure increases the whiteness of a viewed subject under the lighting of the LED module 12 and improves the visibility of characters on a viewed subject, while further ensuring that high color rendering is maintained.

(3) The LED module 12 is configured to have a correlated color temperature in the range from 3250 K to 4400 K and a color shift Duv in the range from 3 to −3. This structure increases the whiteness of a viewed subject under the lighting of the LED module 12 and improves the visibility of characters on a viewed subject, while maintaining high color rendering, when the correlated color temperature of the LED module 12 is in the range from 3250 K to 4400 K.

(4) When the LED module 12 has a correlated color temperature in the range from 3250 K to 5300 K and a color shift Duv in the range from 3 to −3, the blue LED 32 is configured to have a peak wavelength in the range from 450 nm to 475 nm, and the green LED 33 is configured to have a peak wavelength in the range from 510 nm to 530 nm. This structure increases the whiteness of a viewed subject under the lighting of the LED module 12 and improves the visibility of characters on a viewed subject, while maintaining high color rendering, when the correlated color temperature of the LED module 12 is in the range from 3250 K to 5300 K.

(5) When the LED module 12 has a correlated color temperature in the range from 3250 K to 7100 K and a color shift Duv in the range from 3 to −3, the blue LED 32 is configured to have a peak wavelength in the range from 450 nm to 465 nm, and the green LED 33 is configured to have a peak wavelength in the range from 510 nm to 530 nm. This structure increases the whiteness of a viewed subject under the lighting of the LED module 12 and improves the visibility of characters on a viewed subject, while maintaining high color rendering, when the correlated color temperature of the LED module 12 is in the range from 3250 K to 7100 K.

It should be apparent to those skilled in the art that the present invention may be embodied in many other specific forms without departing from the spirit or scope of the invention. Particularly, it should be understood that the present invention may be embodied in the following forms.

In the above embodiment, the color temperature of the white LED 31 is set to approximately 2800 K. However, the color temperature of the white LED 31 may be set to a color temperature in the light color classification for light bulb color as specified by JIS Z9112:2004.

In the above embodiment, the upper limit for the color temperature of the LED module 12 is set to 7100 K based on JIS Z9112:2004. However, if, for example, the standard of JIS Z9112 is changed to allow for 7200 K, the upper limit of the color temperature may be set to 7200 K. Even if the upper limit for the color temperature is set to 7200 K, it is preferable that the general color rendering index Ra be set to 80 or greater.

The present examples and embodiments are to be considered as illustrative and not restrictive, and the invention is not to be limited to the details given herein, but may be modified within the scope and equivalence of the appended claims.

The invention claimed is:

1. A lighting device, comprising:
a light emitting diode module comprising:
a light bulb color light emitting diode including: a blue light emitting diode element and a light transmissive member that encloses the blue light emitting diode element,
the light transmissive member including a green-yellow fluorescent body and a red fluorescent body, and
the light bulb color light emitting diode having a peak wavelength in the range from 580 nm to 630 nm and a half width at the peak wavelength in the range from 120 nm to 175 nm, wherein the light bulb color light emitting diode is specified by Japanese Industrial Standard (JIS) Z9112;
a blue light emitting diode having a peak wavelength in the range from 450 nm to 480 nm; and
a green light emitting diode having a peak wavelength in the range from 500 nm to 530 nm.

2. The lighting device according to claim 1, wherein when the light bulb color light emitting diode has a light emission intensity expressed by 1 at the peak wavelength, each of the blue light emitting diode and the green light emitting diode is configured to have a light emission intensity of 1 or greater.

3. The lighting device according to claim 1, wherein the blue light emitting diode has a peak wavelength in the range from 450 nm to 465 nm,
the green light emitting diode has a peak wavelength in the range from 510 nm to 530 nm, and
the light emitting diode light source is configured to have a correlated color temperature in the range from 3250 K to 7100 K and a color shift Duv in the range from 3 to −3.

4. The lighting device according to claim 1, wherein the blue light emitting diode has a peak wavelength in the range from 450 nm to 475 nm,
the green light emitting diode has a peak wavelength in the range from 510 nm to 530 nm, and
the light emitting diode light source is configured to have a correlated color temperature in the range from 3250 K to 5300 K and a color shift Duv in the range from 3 to −3.

5. The lighting device according to claim 1, wherein the light emitting diode light source is configured to have a correlated color temperature in the range from 3250 K to 4400 K and a color shift Duv in the range from 3 to −3.

* * * * *